United States Patent
Fee et al.

(10) Patent No.: US 9,645,904 B2
(45) Date of Patent: *May 9, 2017

(54) DYNAMIC CACHE ROW FAIL ACCUMULATION DUE TO CATASTROPHIC FAILURE

(71) Applicant: International Business Machines Corporation, Armonk, NY (US)

(72) Inventors: Michael F. Fee, Cold Spring, NY (US); Patrick J. Meaney, Poughkeepsie, NY (US); Arthur J. O'Neill, Jr., Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/247,239

(22) Filed: Aug. 25, 2016

(65) Prior Publication Data

US 2016/0357650 A1    Dec. 8, 2016

Related U.S. Application Data

(63) Continuation of application No. 15/075,897, filed on Mar. 21, 2016, now Pat. No. 9,459,951, which is a
(Continued)

(51) Int. Cl.
*G06F 11/07* (2006.01)
*G06F 11/10* (2006.01)
(Continued)

(52) U.S. Cl.
CPC ........ *G06F 11/2094* (2013.01); *G06F 3/0619* (2013.01); *G06F 3/0653* (2013.01);
(Continued)

(58) Field of Classification Search
CPC ...... G06F 11/0793; G06F 11/07; G06F 11/00; G06F 11/10; G06F 11/16; G06F 11/20;
(Continued)

(56) References Cited

U.S. PATENT DOCUMENTS

| 6,014,756 | A  | * | 1/2000 | Dottling | ............... | G06F 11/141 |
|  |  |  |  |  |  | 711/130 |
| 6,771,541 | B1 | * | 8/2004 | Park | ...................... | G11C 16/08 |
|  |  |  |  |  |  | 365/185.18 |

(Continued)

OTHER PUBLICATIONS

Zhang et al., Two-Layer Error Control Codes Combining Rectangular and Hamming Product Codes for Cache Error, Feb. 24, 2014, MDPI AG, pp. 44-62.*

(Continued)

*Primary Examiner* — John J Tabone, Jr.
(74) *Attorney, Agent, or Firm* — Cantor Colburn LLP; Margaret A. McNamara

(57) ABSTRACT

A technique is provided for accumulating failures. A failure of a first row is detected in a group of array macros, the first row having first row address values. A mask has mask bits corresponding to each of the first row address values. The mask bits are initially in active status. A failure of a second row, having second row address values, is detected. When none of the first row address values matches the second row address values, and when mask bits are all in the active status, the array macros are determined to be bad. When at least one of the first row address values matches the second row address values, mask bits that correspond to at least one of the first row address values that match are kept in active status, and mask bits that correspond to non-matching first address values are set to inactive status.

1 Claim, 14 Drawing Sheets

Related U.S. Application Data continuation of application No. 14/620,790, filed on Feb. 12, 2015.

(51) Int. Cl.

| | | |
|---|---|---|
| *G06F 11/20* | (2006.01) | |
| *G11C 29/00* | (2006.01) | |
| *G06F 3/06* | (2006.01) | |
| *G11C 29/42* | (2006.01) | |
| *G11C 29/52* | (2006.01) | |
| *G11C 29/56* | (2006.01) | |
| *G06F 12/0811* | (2016.01) | |
| *G06F 12/084* | (2016.01) | |
| *G06F 12/0842* | (2016.01) | |
| *H03M 13/19* | (2006.01) | |
| *G11C 29/24* | (2006.01) | |
| *G11C 15/00* | (2006.01) | |
| *G11C 29/04* | (2006.01) | |

(52) U.S. Cl.
CPC .......... *G06F 3/0673* (2013.01); *G06F 3/0679* (2013.01); *G06F 11/07* (2013.01); *G06F 11/073* (2013.01); *G06F 11/076* (2013.01); *G06F 11/079* (2013.01); *G06F 11/0727* (2013.01); *G06F 11/0763* (2013.01); *G06F 11/0772* (2013.01); *G06F 11/0793* (2013.01); *G06F 11/106* (2013.01); *G06F 11/1008* (2013.01); *G06F 11/1024* (2013.01); *G06F 11/1028* (2013.01); *G06F 11/1048* (2013.01); *G06F 11/1064* (2013.01); *G06F 11/20* (2013.01); *G06F 12/084* (2013.01); *G06F 12/0811* (2013.01); *G06F 12/0842* (2013.01); *G11C 29/00* (2013.01); *G11C 29/42* (2013.01); *G11C 29/52* (2013.01); *G11C 29/56008* (2013.01); *H03M 13/19* (2013.01); *G06F 2201/805* (2013.01); *G06F 2201/82* (2013.01); *G06F 2201/85* (2013.01); *G06F 2212/1032* (2013.01); *G11C 15/00* (2013.01); *G11C 29/24* (2013.01); *G11C 29/76* (2013.01); *G11C 2029/0411* (2013.01)

(58) Field of Classification Search
CPC .. G06F 11/073; G06F 11/076; G06F 11/0763; G06F 11/0772; G06F 11/1008; G06F 11/1024; G06F 11/1028; G06F 11/1048; G06F 11/106; G06F 11/1064; G06F 11/1407; G06F 11/1629; G06F 11/1666; G06F 11/18; G06F 11/183; G06F 12/0802; H03M 13/05; G11C 29/00; G11C 29/02; G11C 29/04; G11C 29/42; G11C 29/44; G11C 29/52; G11C 2029/1202

USPC ........ 714/711, 718, 763–768, 773, 774, 777, 714/E11.007, E11.035, E11.037, E11.055; 365/200, 201
See application file for complete search history.

(56) References Cited

U.S. PATENT DOCUMENTS

| | | | | |
|---|---|---|---|---|
| 8,397,130 | B2* | 3/2013 | Clark | G06F 9/3867 714/763 |
| 8,595,570 | B1* | 11/2013 | Ambroladze | G06F 11/1064 714/708 |
| 8,914,708 | B2* | 12/2014 | Meaney | H03M 13/05 714/766 |
| 9,065,481 | B2* | 6/2015 | Meaney | H03M 13/05 |
| 9,286,172 | B2* | 3/2016 | Ramirez | G06F 11/2053 |
| 2002/0181281 | A1* | 12/2002 | Abedifard | G11C 29/70 365/185.09 |
| 2003/0226074 | A1* | 12/2003 | Ohlhoff | G11C 29/56 714/718 |
| 2004/0015651 | A1* | 1/2004 | Chadwick | G11C 15/00 711/108 |
| 2004/0208065 | A1* | 10/2004 | Wu | G11C 29/848 365/200 |
| 2005/0243636 | A1* | 11/2005 | Boldt | G11C 29/83 365/230.03 |
| 2006/0098504 | A1* | 5/2006 | Takita | G11C 11/406 365/200 |
| 2006/0156180 | A1* | 7/2006 | Kang | G11B 20/1803 714/758 |
| 2008/0013388 | A1* | 1/2008 | Asano | G11C 29/848 365/200 |
| 2013/0173970 | A1* | 7/2013 | Kleveland | G11C 29/44 714/710 |
| 2013/0246868 | A1* | 9/2013 | Takagi | G06F 11/073 714/719 |
| 2013/0339808 | A1* | 12/2013 | Ambroladze | G06F 11/08 714/54 |
| 2013/0339822 | A1* | 12/2013 | Meaney | H03M 13/05 714/773 |
| 2013/0339823 | A1* | 12/2013 | Meaney | H03M 13/05 714/773 |
| 2015/0170728 | A1* | 6/2015 | Jung | G11C 8/08 365/222 |
| 2016/0005496 | A1* | 1/2016 | Kim | G11C 29/78 365/96 |

OTHER PUBLICATIONS

Wilkerson et al., Tradiing offff Cache Capaciitty ffor Relliiabiilliitty to Enablle Low Vollttage Operattiion, 2008, IEEE, pp. 203-214.*
Abella et al., On-Line Failure Detection and Confinement in Caches, 2008, IEEE, pp. 3-9.*
Spainhower et al., Design for Fault-Tolerance in System ES/9000 Model 900, 1992, IEEE, pp. 38-47.*

* cited by examiner

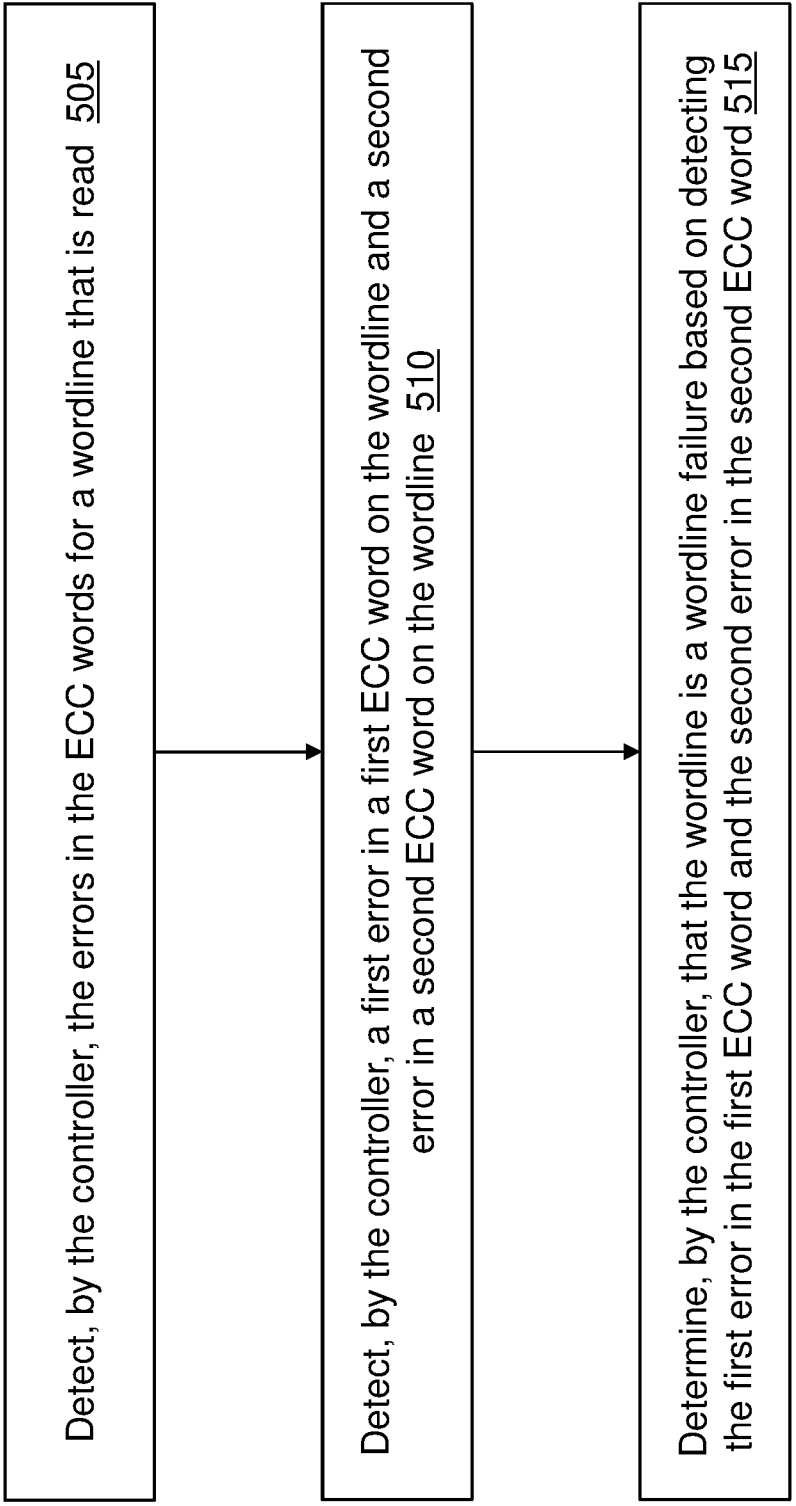

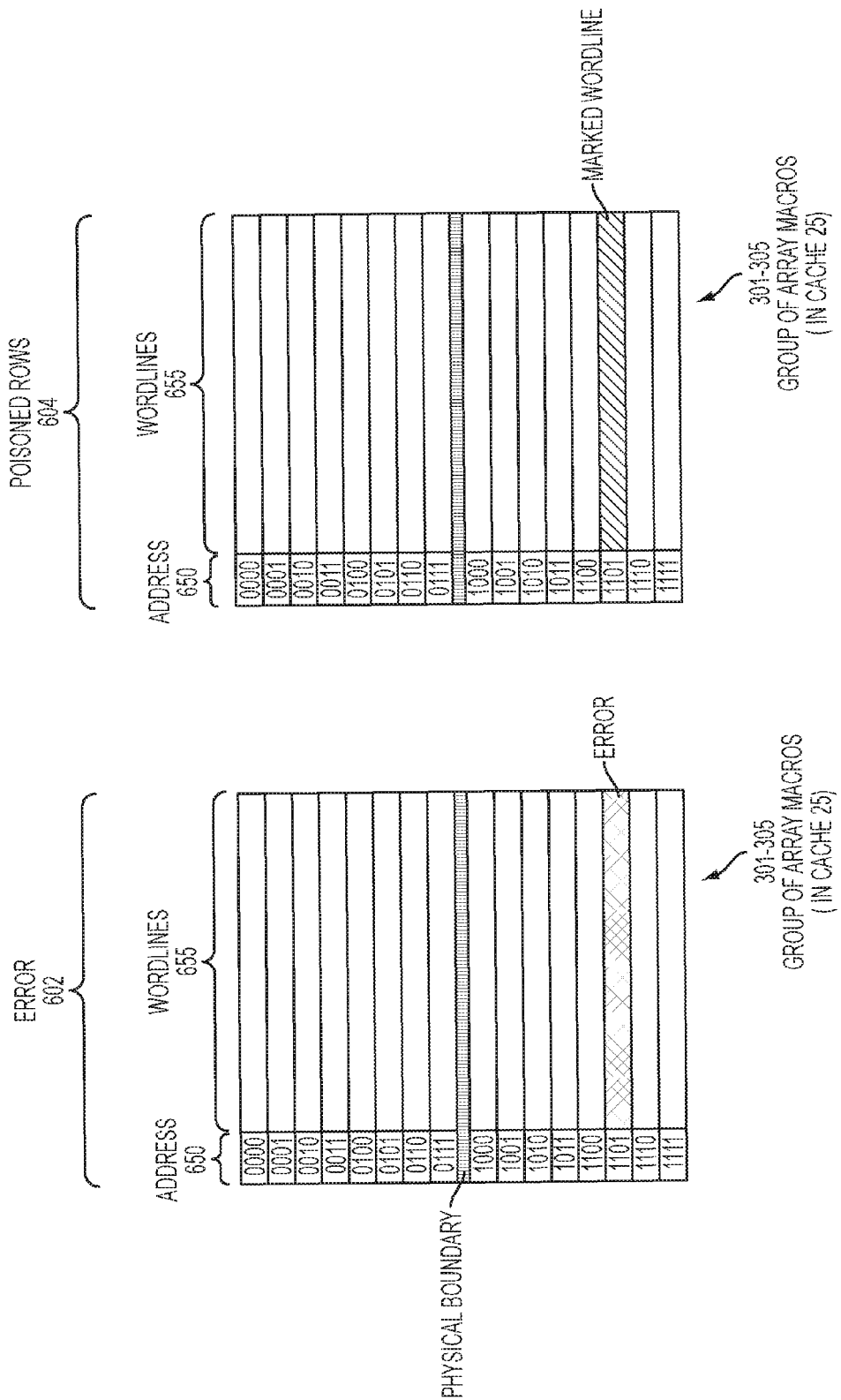

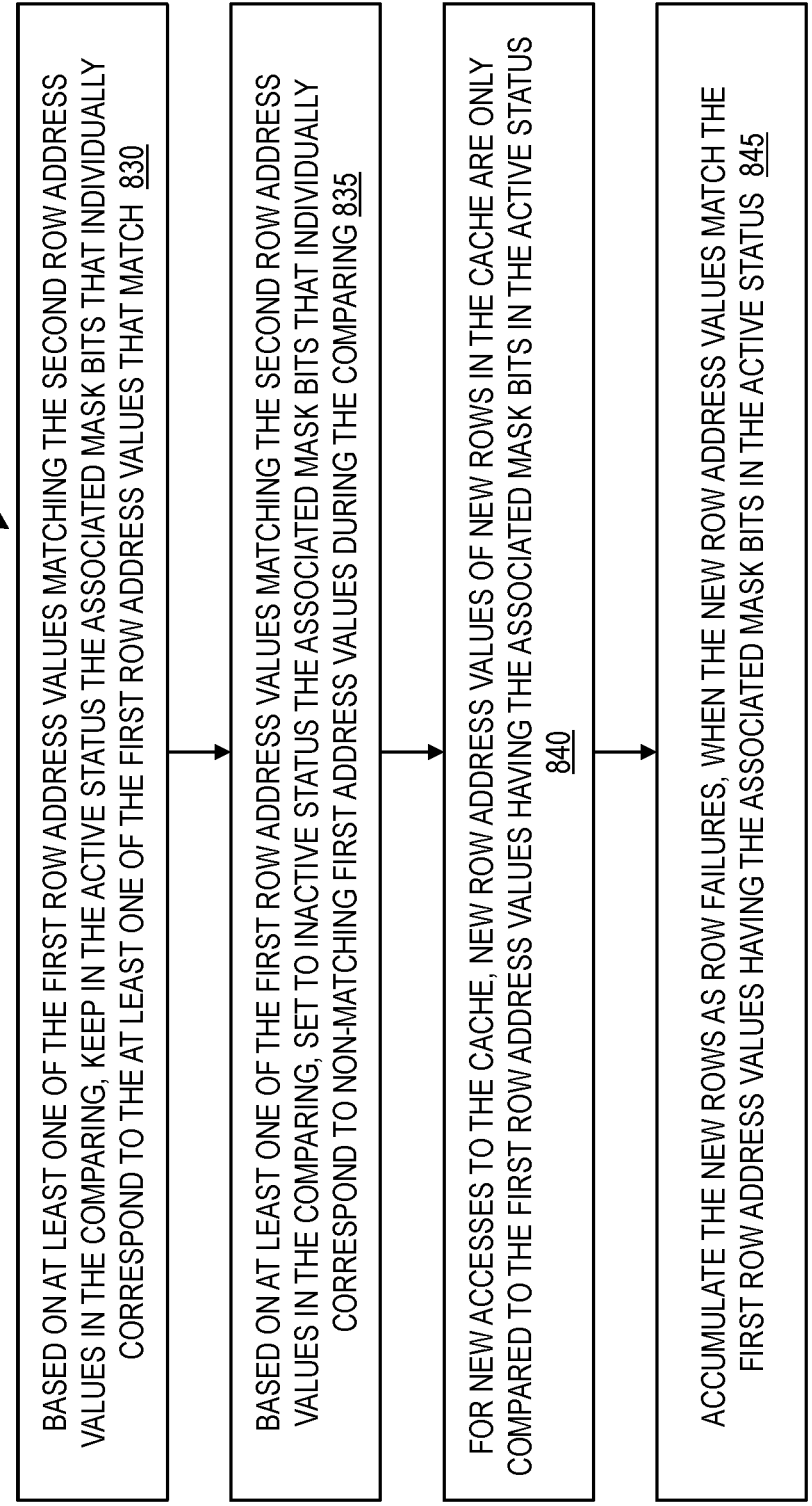

DYNAMIC CACHE ROW FAIL ACCUMULATION DUE TO CATASTROPHIC FAILURE

PRIORITY

This application is a continuation of and claims priority from U.S. patent application Ser. No. 15/075,897, filed on Mar. 21, 2106, entitled "DYNAMIC CACHE ROW FAIL ACCUMULATION DUE TO CATASTROPHIC FAILURE", which is a continuation of U.S. patent application Ser. No. 14/620,790, filed on Feb. 12, 2015, entitled "DYNAMIC CACHE ROW FAIL ACCUMULATION DUE TO CATASTROPHIC FAILURE", the entire contents of which are incorporated herein by reference.

BACKGROUND

The present invention relates generally to error detection, and more specifically, to a dynamic cache row fail accumulation due to catastrophic failure.

A cache memory is a component that transparently retains data elements (or simply data) so that future requests for any retained data can be served faster. A data element that is stored within a cache is associated with a pre-defined storage location within a computer system. Such data element might be a value that has recently been computed or a duplicate copy of the same storage location that are also stored elsewhere. If requested data is contained in the cache, this is a cache hit, and this request can be served by reading the cache, which is comparatively faster than reading from a storage location since the cache is usually built close to its requester. Otherwise, if the data is not contained in the cache, this is a cache miss, and the data has to be fetched from a storage system medium not necessarily close to the requester, and thus is comparatively slower.

In a cache, electrical or magnetic interference inside a computer system can cause a single bit of embedded dynamic random access memory (eDRAM) to spontaneously flip to the opposite state. This can change the content of one or more memory cells or interfere with the circuitry used to read/write them. Also, the circuitry of the cache may fail, and this can change the content of one or more memory cells.

To ensure the integrity of data stored in a data processing system and transmitted between various parts of the system, various error detection and correction schemes have been employed. An error can be a correctable error (CE) or an uncorrectable error (UE). Schemes, such as the Hamming code, can allow for double error detection and single error correction. Typically, before a data word is stored in memory, check bits are generated over the data bits and stored with the data word. When the data word is retrieved from memory, a check is made over the data and the check bits to detect, and if necessary, to correct identifiable bits. In checking the data word and check bits received from memory, a syndrome is generated for each parity group of a multiple byte data word. A matrix, referred to as an H-matrix, may be generated which defines all of the syndromes for which a single error is correctable and which identifies each bit position of the data word which is correctable. When a syndrome is generated which matches the data in one of the columns of the matrix, the bit to be corrected is identified from the matrix and the polarity of the identified bit is changed to correct the data error. Additional tests need to be made to determine whether there are uncorrectable errors. When dealing with 64-bit data words, the H-matrix has 64 columns, plus columns for check bits. The number of syndromes which may be generated and which do not fall within the matrix are considerably larger than the correctable-error syndromes included in the matrix. A typical error correction scheme using 8-bit syndromes for 64 bits of data, and requiring single error correction and double error detection, will have 256 possible syndromes and 72 syndromes associated with correctable errors. The detection of the presence of a correctable error and the presence of uncorrectable errors requires large amounts of detection circuitry.

SUMMARY

Embodiments include a method, system, and computer program product for accumulating failures in a group of array macros by a controller. A failure of a first row is detected in the group of array macros, the first row having first row address values. A mask is configured to have associated mask bits individually corresponding to each of the first row address values, and the associated mask bits are initially all in an active status. A failure of a second row in the group of array macros is detected, the second row having second row address values. The first row address values are compared to the second row address values. Based on none of the first row address values matching the second row address values in the comparing and based on the associated mask bits all being in the active status, it is determined that the group of array macros is bad. Based on at least one of the first row address values matching the second row address values in the comparing, those associated mask bits that individually correspond to the at least one of the first row address values that match are kept in the active status, and those associated mask bits that individually correspond to non-matching first address values during the comparing are set to inactive status. For new accesses to the group of array macros, new row address values of new rows in the group of array macros are only compared to the first row address values having the associated mask bits in the active status. The new rows are accumulated as row failures, in response to the new row address values matching the first row address values having the associated mask bits in the active status.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 5 depicts a flow chart of a method of a controller on a target wordline to find and process errors in accordance with an embodiment;

FIGS. 6A through 6F illustrate fast accumulation of row fails in accordance with an embodiment;

FIGS. 8A and 8B depict a flow chart of a method for accumulating row/wordline failures in accordance with an embodiment.

DETAILED DESCRIPTION

Figure 1:
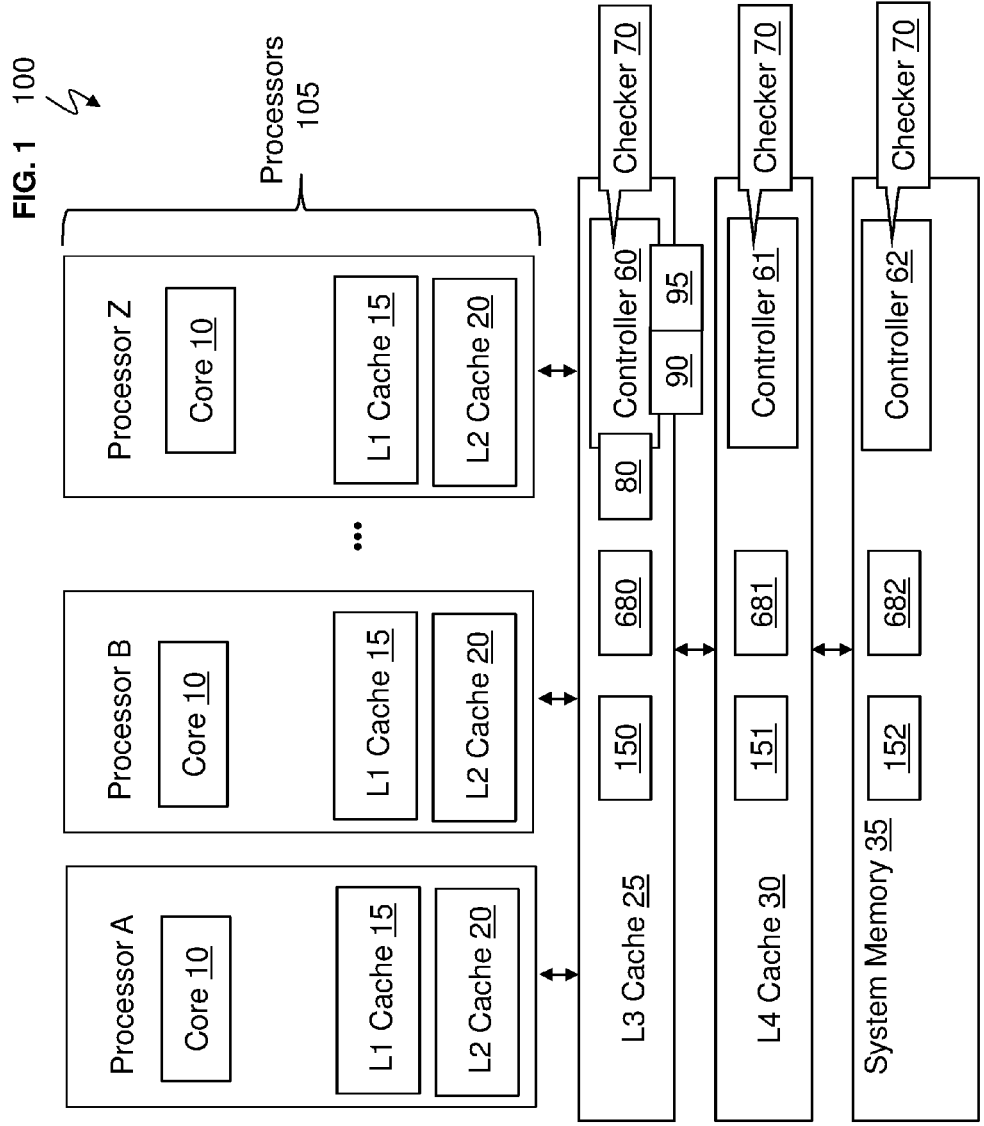
FIG. 1 depicts a block diagram of a computer system in accordance with an embodiment.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

An embodiment discloses a controller for detecting errors by utilizing error correcting code (ECC). When a wordline is read, the controller can detect errors in the respective ECC words. The controller determines a wordline failure when more than one error (of any type) is detected for the wordline.

Random access memory (RAM) is a form of computer data storage that may be utilized in caches. As technologies become more dense, reliability defects in SRAMs (static random access memory), EDRAMs (embedded dynamic random access memory), DRAM (dynamic random access memory), and Regfiles (register files) are becoming more likely. These can affect implementations for storage, memory, and cache. While most cache designs have ECC (error correcting code) protection to detect and correct some types of errors (like bitline and single-cell errors), wordline errors may or may not be detected with high probability. There are also forms of subarray or array errors that can also go undetected or be mis-corrected as a correctable error, when, in fact, the data is unusable and uncorrectable.

For instance, in an ECC word with SEC/DED or SECDED (Single Error Correct, Double Error Detect), single bit errors are corrected with 100% probability while double-bit errors are detected (but not corrected) with 100% probability. Once three or more bits fail, the ECC may flag uncorrectable errors (UEs) but there are also probabilities of mis-corrected data (false CEs). For a 72/64 ECC SEC/DED Hamming Code, this probability of a mis-correct on a random hit of many bits (e.g., >=3) is approximately 29%. Typically, this percentage is acceptable when errors have geometrically or exponentially decreasing probabilities for failure (e.g. probability, p, of a single bit in error and probability of $p^2$ for two random errors, $p^3$ for 3 random errors, etc.). For most server systems, if a gross error causes many bits to fail at once, a 29% mis-correct rate is unacceptable.

In an embodiment, a cache controller (e.g., circuit) makes use of checking multiple ECC words accessed with the same wordline (or subarray or other common regions of logic or arrays) to detect gross errors with a higher degree of detection. This, in turn, is used to protect the data (through a UE indicator, a system checkstop or other means, depending on the needs of the system).

In the present disclosure, some of this checking on multiple ECC words (groups) comes relatively cheaply. For instance, on a cache design, often data is fetched in multiple shots (e.g., blocks) of data from a host of array macros. Data can be organized in a cache to take advantage of multiple checking, for instance, by ensuring that multiple words of data are fetched from the same components rather than distributed across many components. This allows, in a very brief one or two cycle window, for data to be fetched and checked from multiple ECC groups at a time.

Figure 4:
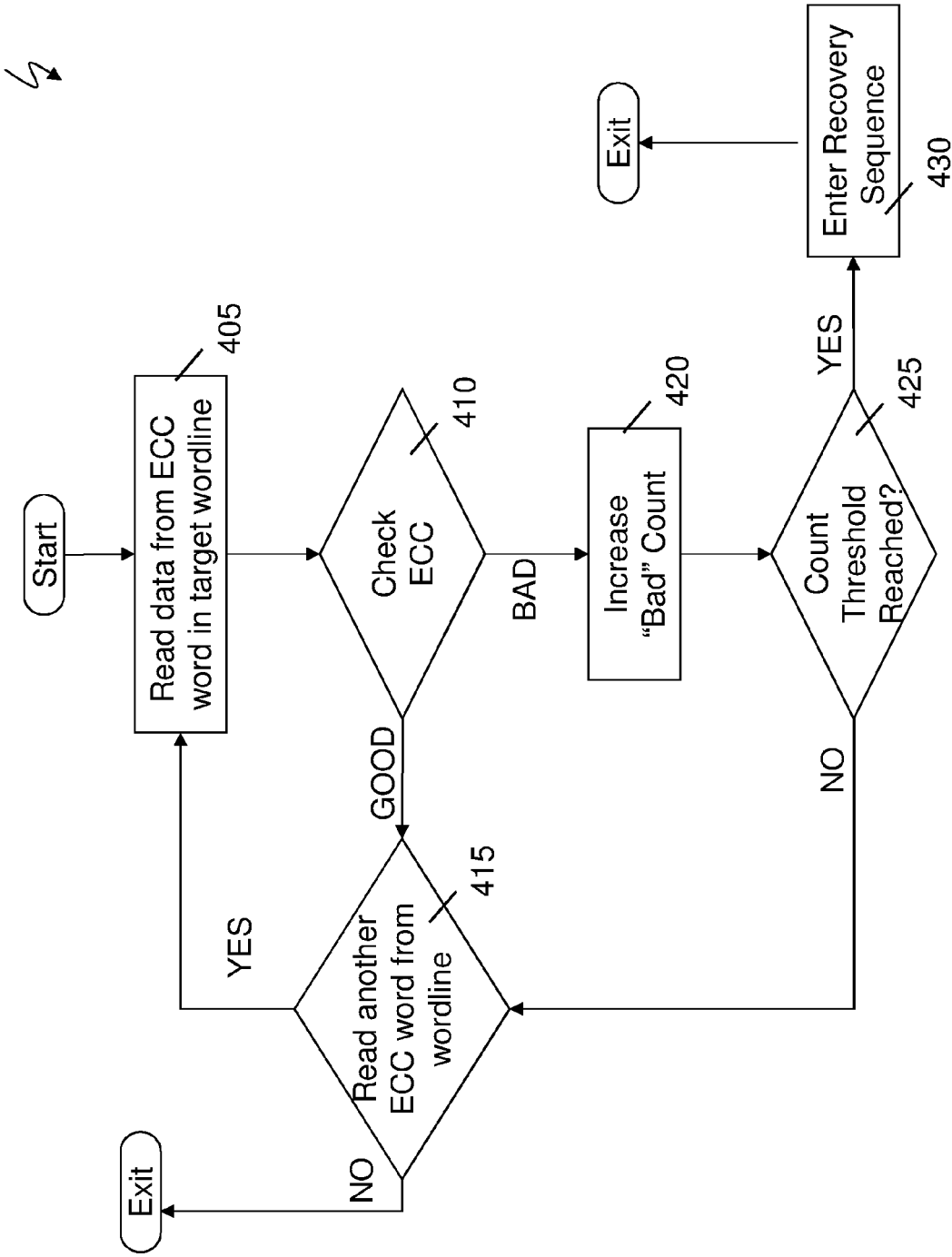
FIG. 4 depicts a flow chart of processing errors in accordance with an embodiment.

To prevent the standard volume of ECC words and probabilities of false errors from going undetected, the use of restricted "CE" or a "UE" information from multiple ECC groups is favored over a more lax "ORing" (logical "or" statements/evaluations) of just the UE cases. The restriction of only allowing a single correctable error in one ECC group is much more effective as discussed herein according to an embodiment. The calculations (for example) are shown in FIGS. 4 and 5.

Turning now to FIG. 1, a block diagram of a computer system 100 is generally shown according to an embodiment. The computer system 100 includes one or more processors 105 (i.e., central processing units) such as processor A through processor Z. The processors 105 may each have one or more processor cores 10 (e.g., single core, dual core, quad core, etc.), and the processor cores 10 may be referred to as circuitry.

The processors 105 may each include (on chip) a level one (L1) cache 15 and a level two (L2) cache 20. The L1 cache 15 and L2 cache 20 may be on-processor (hardware) memory for caching (i.e., retaining) data on the processor 105. The processors 105 may be operatively connected to a level three (L3) cache 25 which is operatively connected to a level four (L4) cache 30.

Data retrieved from system memory 35 may be cached in any of the caches (e.g., in the L1 cache 15, L2 cache 20, L3 cache 25, and/or L4 cache 30). Typically, the L3 cache 25 and L4 cache 30 are larger than the on-processor L1 cache 15 and L2 cache 20.

Each of the memory storages such as the L1 cache 15, L2 cache 20, L3 cache 25, L4 cache 30, and system memory 35 may include a memory controller. For example, L3 cache 25 may include (cache) controller 60, L4 cache 30 may include (cache) controller 61, and system memory 35 may include (memory) controller 62.

Figure 2:
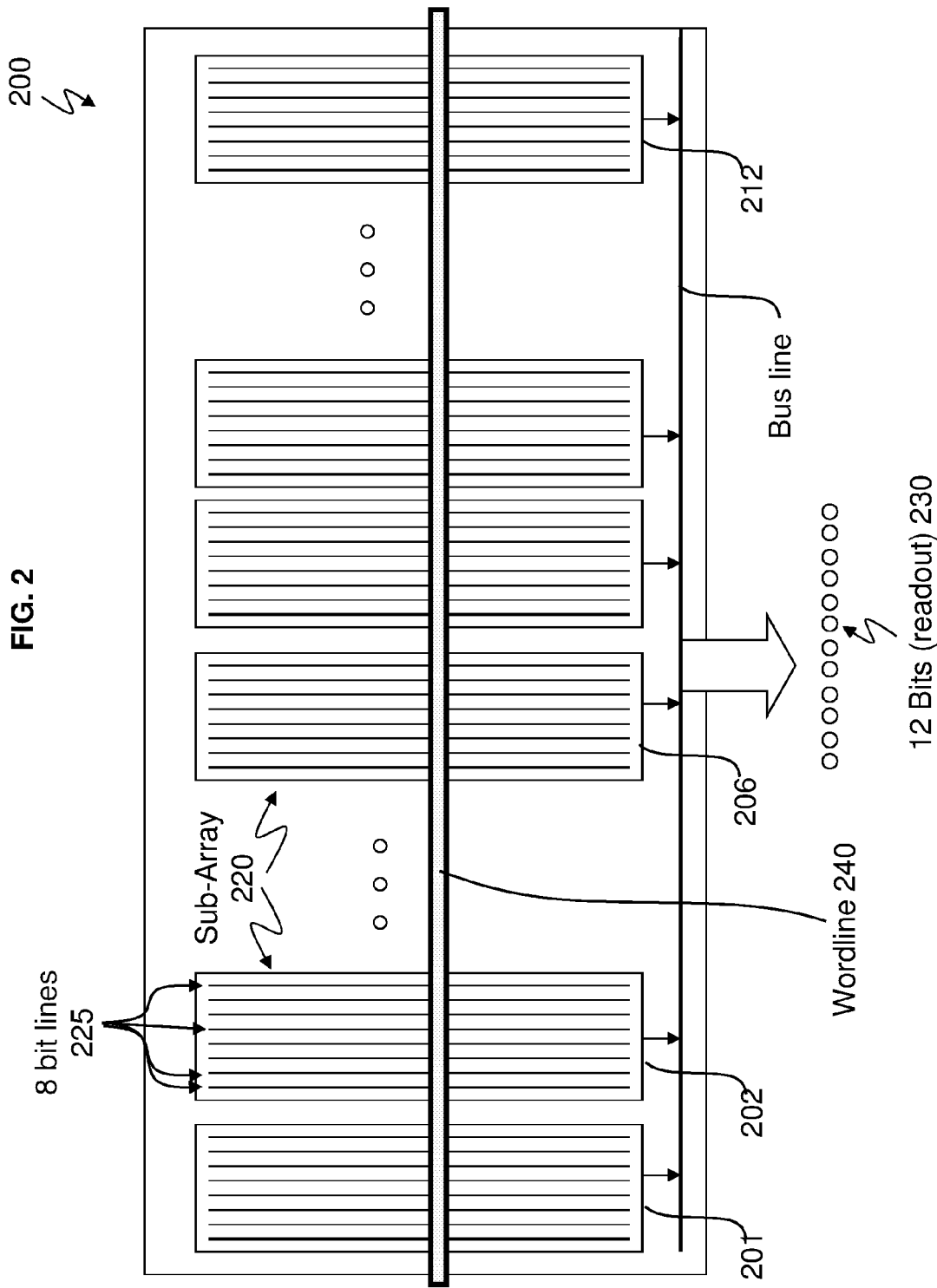
FIG. 2 depicts an array macro of memory elements/cells in accordance with an embodiment.

FIG. 2 illustrates an example of an array macro 200 of memory elements/cells in accordance with an embodiment. The array macro 200 of memory elements includes numerous circuits for storing data as understood by one skilled in the art. The L1 cache 15, L2 cache 20, L3 cache 25, L4 cache 30, and/or system memory 35 may be represented by, on, or a combination of the array macros 200 of memory elements.

For ease of explanation and not limitation, reference is made to the L3 cache 25 for example scenarios below and it is contemplated that the various explanations analogously apply to any memory (resource) such as the L1 cache 15, L2 cache 20, L4 cache 30, and system memory 35.

For example purposes, the array macro 200 shows 12 concurrently accessed data bits 230 which are also referred to as an array word (i.e. a word or group of bits coming out of one array). The 12 bits are associated with an address region known as being part of a group, a compartment, and/or a set. Each subarray 220 is shown with 8 bit lines 225. The bit lines are shown as vertical lines in each subarray 220, with each read concurrently accessing one bit line 225 per subarray 220.

A wordline such as the wordline 240 is read (by the controller 60) across each of the 12 subarrays 220 (labeled as instances 201, 202 . . . , 206 . . . , and 212) to have, e.g., 12 bits read out 230. The 12 bits are shown as individual circles 230 in FIG. 2. Two different bitlines 225 connected to a common wordline 240 access two different bits (each bit is at the intersection of the wordline 240 and a bitline 225) which may be included in a common cache line or in two separate cache lines. In the state of the art, if a common wordline 240 failed and caused errors in two different ECC words, they were always checked independently, regardless of the use of the common failing wordline 240, allowing higher miscorrection rates. In the present disclosure, ECC words are identified which contain data from a common failing wordline 240.

Figure 3:
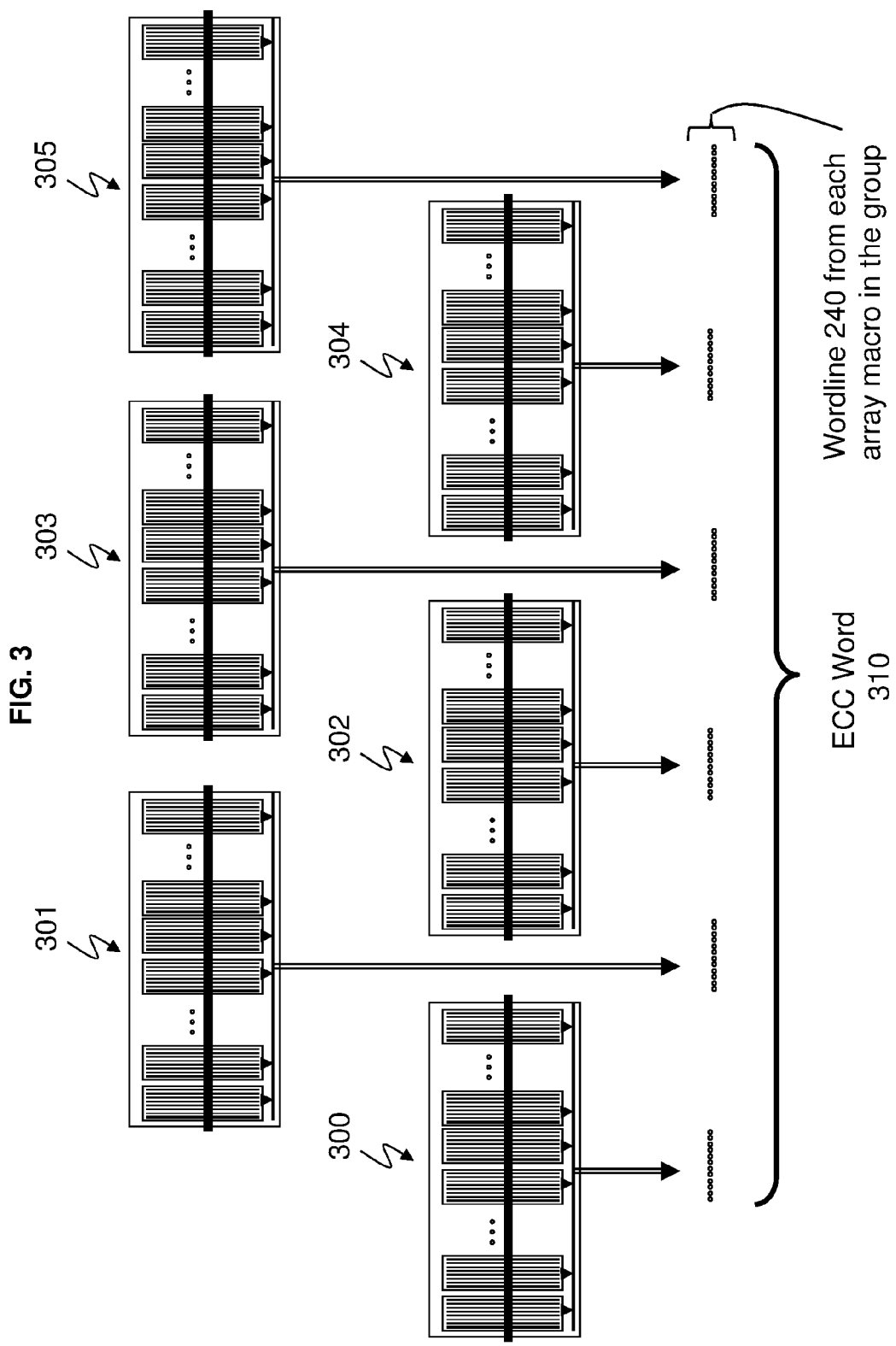
FIG. 3 depicts a group of arrays accessed simultaneously to provide a complete word of data to the error correcting logic according to an embodiment.

FIG. 3 depicts a complete ECC word 310 being read from 6 array macros 300, 301, 302, 303, 304, and 305, each of which is an instance of the array macro 200. Each of the 6 arrays 300, 301, 302, 303, 304, and 305 supplies a 12 bit readout 230, together forming a complete 72 bit ECC word 310. The group of array macros 300, 301, 302, 303, 304, 305 operate together as a single ECC word 310. Although a single group of macros 300-305 are shown in FIG. 3 for illustration purposes, the single group of macros 300-305 represents many identical groups array macros in the cache. For example, the group of array macros 300-305 may be one of hundreds of identical (or nearly identical) groups of array macros 300-305 in the cache (such as in the L1 cache 15, L2 cache 20, L3 cache 25, L4 cache 30, and/or system memory 35). Since there are numerous groups of array macros 300-305, there are numerous ECC words 310 in the cache. The ECC checker 70 of, e.g., the controller 60 is configured to detect errors in the ECC word 310 comprising data from wordline 240 of the accessed arrays 300, 301, 302, 303, 304, and 305 by using error correcting code (check bits), for example a SEC/DED Hamming Code as understood by one skilled in the art. Additionally, the checker 70 incorporates checking that operates between multiple ECC words 310 read from other sets (bitlines 225) of the same wordline 240.

For example, the following cases are provided below in which the controller 60 (e.g., via checker 70) is configured to look for and detect the errors.

Case 1: A CE in one ECC word is treated as a CE when the other ECC words have zero syndrome (no mathematical error). On the other hand, the controller 60 is configured to treat two CEs (in two different ECC words 310 which are accessed using the same wordline, e.g., 240 or other element) as a wordline (or element) failure. This is because the ECC code is not intended to tolerate a wordline (element) failure in the checker 70 according to an embodiment. So, the mathematical probability of multiple ECC words (groups) 310 in a close time (proximity) and/or during a common access both having independent CEs is rare. Accordingly, the checker 70 in the controller 60 is configured to detect two CEs in two independent ECC words 310 from arrays 300, 301, 302, 303, 304, and 305 when different bitlines 225 of the same wordline 240 are accessed on successive reads. Therefore, the multiple CEs that are detected may be more likely random data which could be incorrect, uncorrectable data that happens to look like CEs, and the checker 70 is configured to detect this. The checker 70 in the controller 60 is configured to treat these two CEs for the two separate ECC words 310 read on the same wordline 240 as UEs. When the controller 60 detects the two CEs for the two separate ECC words 310 read on the same wordline 240, the controller 60 is configured to set a wordline flag 80 (wordline delete, and/or system checkstop) to protect the wordline 240 (as a wordline failure).

Case 2: The detection of a UE in any of the independent ECC words 310 that are from the same wordline 240 is used by the controller 60 to set the wordline flag 80 (wordline delete and/or system checkstop) to protect from a wordline failure. The term "wordline" can also indicate an element or component, such as a wordline, a submacro, a macro, a chip, etc.

Case 3: In an alternate embodiment, rather than treating any UE in any independent ECC word 310 as a condition to set a wordline flag 80, the detection of a UE in two different, independent ECC words 310 that are from the same wordline 240 is used by the controller 60 to set the wordline flag 80 (wordline delete and/or system checkstop) to protect from a wordline failure. The checker 70 can detect a UE in both ECC word 1 and ECC word 2, and the checker 70 in controller 60 is configured to set the wordline flag 80.

Case 4: In another embodiment, a CE in any independent ECC word 310 combined with a UE in any other independent ECC word 310 that are from the same wordline 240 are used as a condition to set a wordline flag 80. This condition exists whether the CE is detected first and then the UE or the UE is detected first and then the CE.

To prevent the standard volume of ECC words and probabilities of false errors from going undetected, the checker 70 in the controller 60 is configured to use (i.e., take into account) a CE and/or a UE in any two or more ECC words 310 (in a wordline, such as the wordline 240) which is more effective than ORing (logical "OR" statements/evaluations) the UE cases. Example calculations are shown in FIGS. 4 and 5.

Consider a scenario in which the checker 70 of the controller 60 reads out the wordline 240 of the ECC words 310. For the same wordline 240, the checker 70 in the controller 60 is configured with logical circuits to determine a bad wordline (and then set the wordline flag 80, e.g., to take that particular wordline offline 240) for any two or more independent ECC words 310 having the following cases:

One ECC word 310 with UE+another ECC word 310 with CE;

One ECC word 310 with CE+another ECC word 310 with CE;

One ECC word 310 with CE+another ECC word 310 with UE; and/or

One ECC word 310 with UE.

In an embodiment, the presence of any UE in any of the ECC words in a group can be considered as a condition to set wordline flag 80 in the controller 60, thus using a UE (two or more bits in error) to also detect a wordline failure.

State of the art systems do not have wordline detection as a design objective, but may in some cases be able to avoid wordline faults in large block data accesses, for example in a full cache line composed of multiple ECC words. In such cases, a complete cache line access of, for example, 256 bytes might make multiple accesses to the same array wordline to obtain all the data comprising the cache line. If the entire cache line was rejected due to a UE in any of the ECC wordlines, some coverage of undetected faults in other ECC words might be obtained due to rejection of an entire cache line due to a UE on any of the ECC words of the cache line. This "OR" of ECC results of each word 310, whereby a UE on any word of the cache line is handled as a fault on the entire cache line (all words of the cache line). This design may detect a single cache line error but not a wordline error. For instance, other cache lines on the wordline that do not have a detected UE will not be marked as a UE as containing data from a bad wordline.

However, the checker 70 shows error checking enhanced to improve wordline error detection as provided by the present disclosure. Each additional ECC word 310 is checked for an error and then compared to previously checked ECC words 310 in that wordline 240, such that any two separate ECC words 310 having an error (any type of error (CE and/or UE) are marked as a UE. Any UE is treated as a wordline error and should feed the checker 70 in the controller 60.

The checker 70 of the controller 60 is configured to assume (account) that all reads of the ECC words 310 (e.g., ECC word 1, ECC word 2, through ECC word 8 corresponding to bitlines 1 to 8 225 of a subarray 220) are in a close enough timeframe/proximity of one another. These 8 ECC words from the same array wordline 240 might all be read as part of a single cache line access of 32 ECC words, and completed in 8 clock cycles.

As another scenario, consider an example of checking on the first ECC word 310 (which could be any in the ECC words 1-8) and then checking for errors on the next ECC word (which is another ECC word using the same array wordline 240) according to an embodiment. If there is ever a UE in any of the ECC words 310, the checker 70 of the controller 60 flags all the data words as uncorrectable. If only one ECC word 310 has a correctable error detected and all the other ECC words have an indication of clean data, the data is assumed to be a single bit error and is corrected in the ECC word 310 that had indicated a CE. The only way clean data is assumed and is not corrected is when all ECC words 310 in the group of ECC words indicate no errors.

Once the controller 60 detects the (two or more) errors on the same wordline 240 as discussed herein, the controller 60 may be configured to perform any combination (or all) of the following options (i.e., recovery sequence discussed below) to guard the bad wordline 240 from further use, thus protecting future data (that would have been stored on the bad wordline 240 but is, instead, routed to a different region of the cache).

Once the above special case conditions (CE/CE, CE/UE, UE/CE, and/or UE/UE) (with optional cases of (UE/good and good/UE) are detected by the controller 60 between at least two ECC words 310 on the same wordline 240, the controller 60 stores the failing wordline 240. Any future reference to that wordline, even if the wordline 240 looks clean or like a single CE, will be flagged as a UE by the controller 60. This requires the controller 60 to save the wordline address for future comparisons.

The controller 60 may be configured to perform and/or cause a dynamic (or static) repair of the bad wordline that has been detected.

The controller 60 may be configured to fence off a group of macros or wordlines (in the array macro 200) that have had one of these UEs detected. This could be dynamic or require a restart of the computer system 100.

Additionally, the controller 60 may perform and/or initiate calling home on such an event, such that the bad wordline 240 can be repaired (e.g., ticketed for repair).

FIG. 4 is a flow chart of an example process 400 executed by the (e.g., the checker 70) controller 60 according to an embodiment. Reference can be made to FIGS. 1-3 and their corresponding discussions.

At block 405, the controller 60 is configured to read data from the target wordline (which in this case is the wordline 240). One skilled in the art understands that there are previous wordlines above the wordline 240 and subsequent wordlines below the wordline 240. The wordline 240 has been pointed out for explanation purposes, and the discussions apply to all wordlines as understood by one skilled in the art.

The controller 60 is configured to check the given ECC word 310 (on the target wordline) for errors at block 410. For example, the controller 60 executes error correcting code that checks the ECC bits for this ECC word 310 to determine whether there are any errors (e.g., CE, UE).

When no error is found in the data of the ECC word 310 (i.e., good status), the controller 60 is configured to read the next ECC word 310 on the target wordline 240 at block 415. This is so that the controller 60 can determine if the next ECC word 310 on the target wordline has an error. If there are no more ECC words 310 to be read for the target wordline 240, the process 400 exits for this wordline 240. For example, the controller 60 can move to the next target wordline to begin the process 400 again.

However, if there is another ECC word 310 on the target wordline 240 that has not been read, the controller 60 moves to block 405 to read data from the next ECC word 310.

Returning back to block 410, if the controller 60 determines that there is an error in the data ECC word 310 (i.e., bad status) that was read out, the controller 60 is configured to increase a bad count 90 at block 420.

At block 425, the controller 60 determines whether a count threshold 95 has been reached by comparing the bad count 90 to the count threshold 95. The count threshold 95 stores the errors (UE and CE) found in the target wordline 240 when reading data out of the ECC word 1 through ECC word 8, or another number of ECC words deemed sufficient to detect wordline faults with sufficient reliability. The count threshold 95 may be set at 2, which takes into account an error being found in one ECC word 310 and then another error being found in a second ECC word 310 on the same wordline 240. If the count threshold 95 has not been reached, the controller 60 moves to block 415. If the count threshold 95 has been reached, the controller 60 enters a recovery sequence at block 430 and then exits. The controller 60 marks the wordline 240 as a wordline failure via the bad wordline flag 80.

As discussed herein, FIG. 5 is a flow chart of a method 500 performed by the controller 60 on a target wordline (such as the wordline 240) to find and process errors and then determine a wordline failure according to an embodiment. Reference can be made to FIGS. 1-4 and their respective discussions.

The controller 60 is configured to detect the errors in the ECC words 310 for the (target) wordline 240 that is read at block 505. The controller 60 is configured to detect a first error in a first ECC word 310 (e.g., in ECC word 2) on the wordline 240 and a second error in a second ECC word 310 (e.g., in ECC word 6 corresponding to bitline 6 out of the 8 bitlines 225 in a subarray 220) on the wordline 240 at block 510. The controller 60 is configured to determine that the wordline 240 is a wordline failure based on detecting the first error in the first ECC word 310 and the second error in the second ECC word 310 at block 515.

As technology sizes decrease previously unseen failure modes are emerging in caches. Embodiments herein discuss methods to cover these failures. One particular type of failure is the catastrophic array row (wordline) fail. As discussed above, embodiments disclose distributing data across arrays and algorithms to detect the fails. Below provides new techniques for surviving this catastrophic fail. Example scenarios continue to use the L3 cache 25 (with its controller 60) but apply by analogy to the L1 cache 15, L2 cache 20, and L4 cache 30 (having their respective processors and/or controllers). The controller 60 is configured to provide row fail (failure) accumulation for the L3 cache 25 according to embodiments.

Embodiments are configured to provide dynamic cache row fail accumulation as discussed further below. The controller 60 monitors the data being read out of the cache 25 using the techniques outlined herein (e.g., in FIGS. 4 and 5). If the fail mechanism is determined to have occurred by controller 60, the data being accessed is poisoned with special uncorrectable errors (SPUEs). The row address location in the array is then trapped and all future accesses to that array location are poisoned. Furthermore, future accesses to that array/cache are monitored, and this allows the controller 60 to cover multiple fail modes rather than just the single row fail. Embodiments provide a technique to show that a larger portion of the array has failed using only two registers in the following manner:

1) The array is monitored for a row fail (as discussed above herein).

2) For a row fail, the row is trapped (i.e., the failed row address bits/value is stored in a trap register), and a mask has all of it bits initially set to ones (1's) (i.e., set to active status).

3) Future accesses to that failed row have special uncorrected errors (SPUEs) forced on its data.

4) If a failure is detected on another row: a) That row (row address bits/value) is compared with the current trapped row (failed row address bits/value). b) For any address bits that do not compare (i.e., that do not match the failed row address bit/value), the associated mask bit is reset (i.e., set to inactive status). c) New accesses (of other rows) only compare their row address bits/values to the row address bits/values (of the trapped (failed) row) that have a mask bit active. d) Accesses to row bits that match the trapped row address bits/values having their mask bit on have SPUE forced on these new rows.

5) This process allows for fast accumulation of row fails.

One example scenario is illustrated in FIGS. 6A through 6F according to an embodiment. FIGS. 6A through 6F illustrate fast accumulation of row fails as executed by the controller 60.

FIG. 6A is an illustration of a logical view of the combination of the group of array macros 300-305 (i.e., forming the ECC word 310), such as for example, in the L3 cache 25. View 602 shows the cache 25 with wordlines 655 and their respective row addresses 650. Each one of the wordlines 655 has a unique row address value 650, and each row address value 650 has 4 bits. One of the wordlines 655 can be the wordline 240. The view 602 shows that the controller 60 has determined an error in one of the wordlines 655. In this example, the controller 60 is configured to determine that the error is on the wordline having the row address value/bits 1101.

FIG. 6B shows view 604 illustrating that the wordline for row address bits/values 1101 is marked as poisoned such that data is no longer stored on and/or accessed from this poisoned wordline/row. In other words, the wordline for row address value 1101 has failed. The row address value 1101 of the poisoned wordline is trapped in a register 150 in the L3 cache 25 (i.e., the row address value 1101 is stored in the register 150 by the controller 60). The L4 cache 30 includes the register 151 and the system memory 35 includes register 152 for respectively storing their poisoned rows.

Figure 6C:
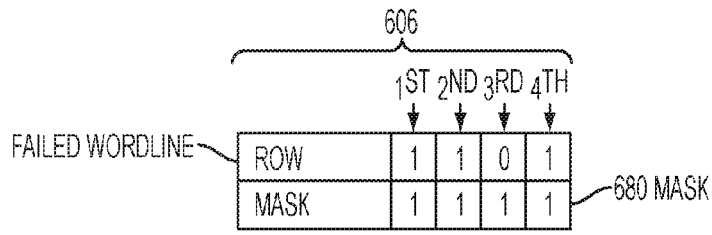

FIG. 6C shows view 606 which illustrates the trapped row address value 1101 for the (failed) wordline marked as poisoned, along with the corresponding mask bits in a row compare mask 680. The row compare mask 680 may be stored in the cache 25, and in one case, the row compare mask 680 may be stored in the register 150 along with the trapped row address value 1101 for the failed wordline. The L4 cache 30 and the system memory 35 each include their own row compare masks 681 and 682, respectively, for row comparisons as discussed herein.

The row compare mask 680 is shown with four bits, and each bit of the row compare mask 680 is directly associated with a corresponding row bit in the row address value 1101 of the failed wordline. For example, the 4 bits of the row compare mask 680 have a one-to-one relationship with the 4 bits in the row address value 1101 of the failed wordline, such that the first bit in the row compare mask 680 corresponds to the first bit in the row address value 1101, the second bit in the row compare mask 680 corresponds to the second bit in the row address value 1101, the third bit in the row compare mask 680 corresponds to the third bit in the row address value 1101, and the fourth bit in the row compare mask 680 corresponds to the fourth bit in the row address value 1101. The individual bits of the row compare mask 680 indicates whether the corresponding bit/value of the row address value 1101 is to be compared against the row address value of a new wordline error. A one (1) in the row compare mask 680 denotes an active status for comparing against the corresponding row address bit of the failed wordline while a zero (0) in the row compare mask 680 denotes an inactive status for comparing against the corresponding row address bit.

Figure 6D:
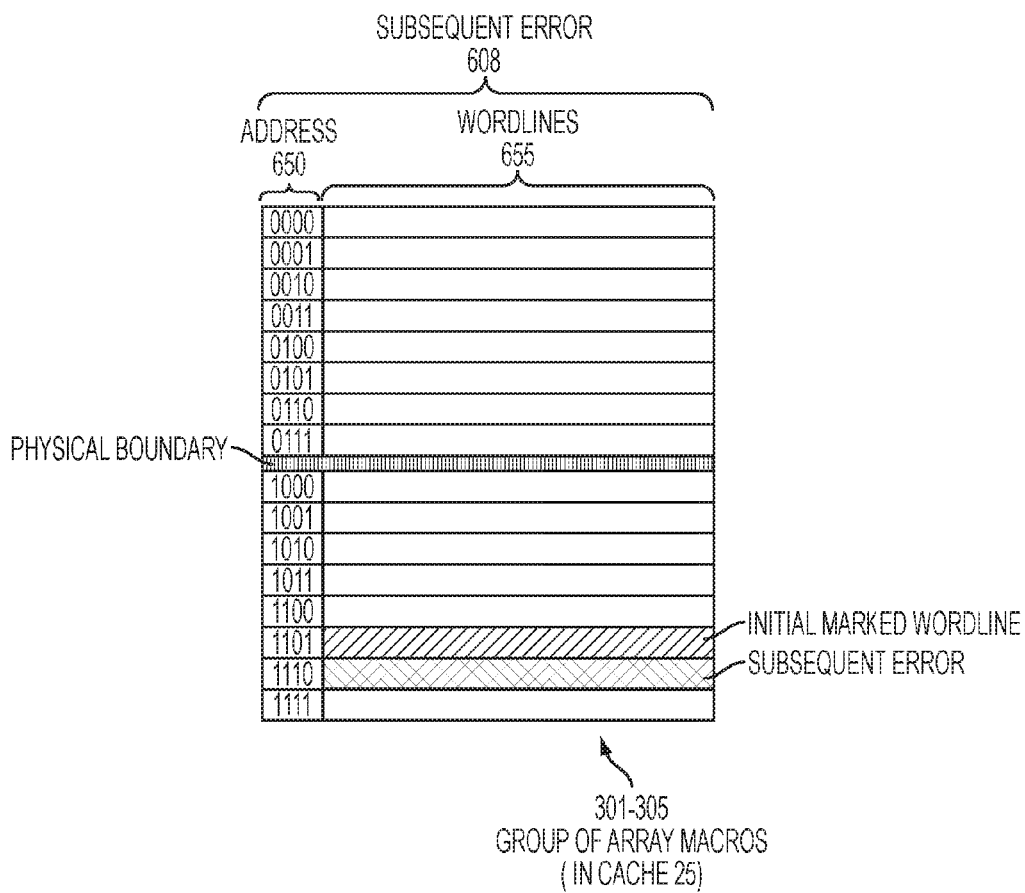

FIG. 6D shows view 608 which illustrates that the controller 60 has found a subsequent error in the same cache 25 that contains the (failed) wordline having the row address value 1110. Since the view 606 shows that all of the mask bits in the row compare mask 680 are initially in active status (e.g., all turned on by having a 1 in the first, second, third, and fourth bits of the row compare mask 680), the controller 60 is configured to compare each individual row address value 1101 (of the trapped/failed wordline) against the row address value 1110 of the new wordline with an error. Each row address bit position of the row address value 1101 is compared against each corresponding row address bit position in the row address value 1110 of the subsequent error to determine if a match is found. From this comparison, the controller 60 determines that the first bit position and the second bit position in the row address value 1101 of the trapped row (poisoned wordline) match the first and second bit positions in the row address value 1110 of the subsequent error. That is, they both have a '1' in the first bit position and the second bit position.

Figure 6E:
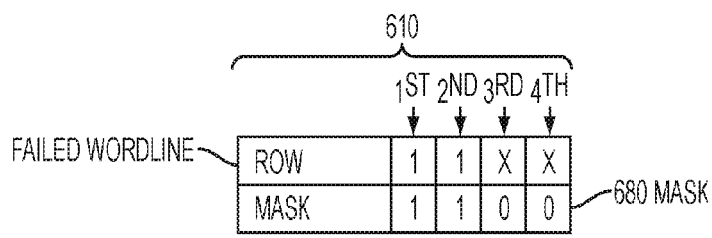

When the controller 60 determines that certain row address bit positions of the row address value 1101 match the same row bit positions in the row address value 1110 (i.e., the wordline with the subsequent error in the cache 25), the controller 60 is configured to modify mask bits in the row compare mask 680, such that only the row bit positions that match remain in active status (i.e., stay turned on) in the row compare mask 680, while the non-matching row bit positions are reset to inactive status. For example, FIG. 6E shows view 610 which illustrates that the row compare mask 680 has zeros (0's) in the third and fourth mask bit positions because the row address value 1101 did not match the third and fourth row bit positions of the row address value 1110. Therefore, the controller 60 has reset the third and fourth mask bit positions to zero in the row compare mask 680, such that for new accesses to the cache 25 no comparison is to be made against the third and fourth row address positions in the trapped row address value 1101. Accordingly, for a new row address value of a wordline accessing the cache 25, the controller 60 is configured to only compare the first and second row address bit positions of the trapped row address value 1101 against the first and second row address bit positions of the new row address value of the wordline (because the row compare mask 680 has nullified the comparison of the third and fourth row address bit positions). For each new access to the L3 cache 25, any row address bit matching the trapped row address value 1101 (corresponding to their mask bits on (active) (e.g., the first and second row address bit positions)) will be marked poison (in the cache 25) by the controller 60.

Figure 6F:
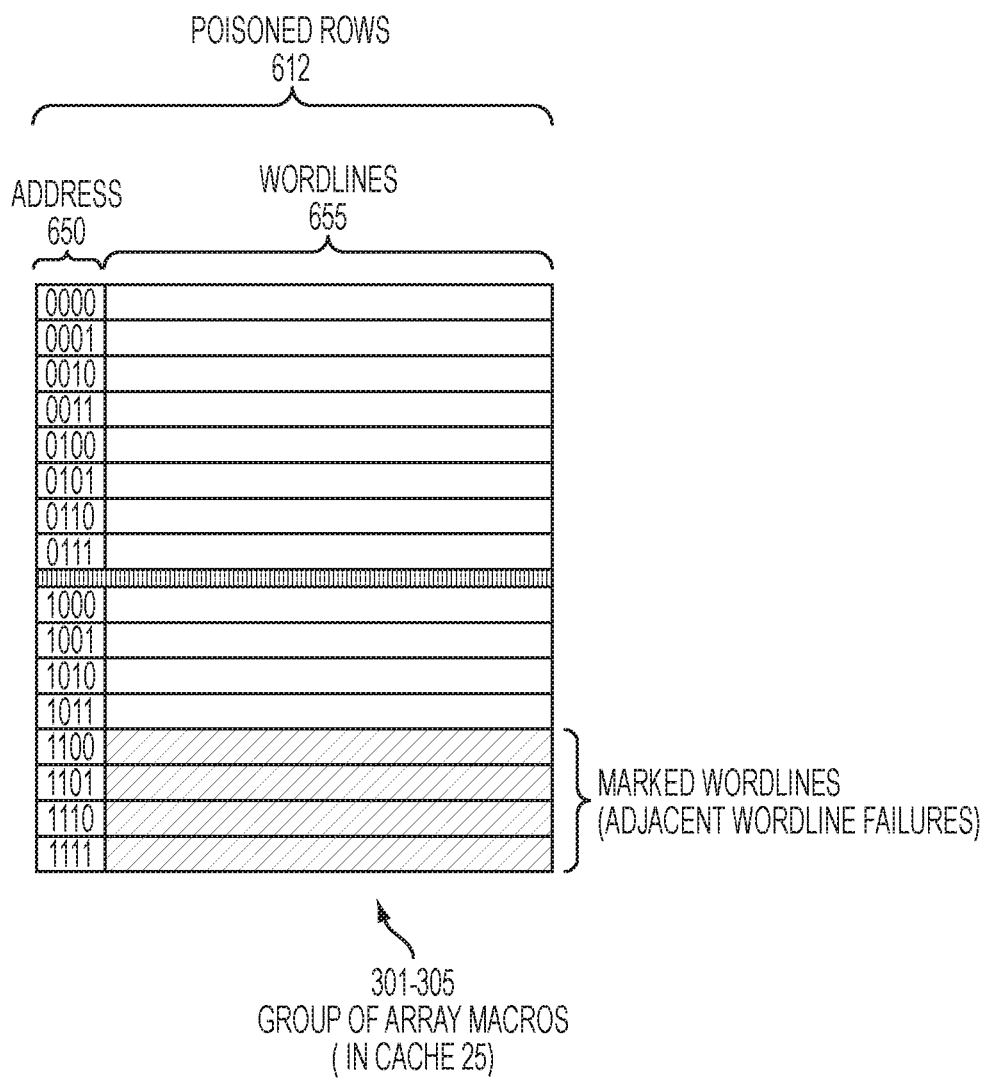

Further, FIG. 6F shows that the controller 60 is also configured to automatically and preemptively accumulate row failures, e.g., adjacent wordline failures, by finding wordlines in the cache 25 that have the row address values matching the first and second row address bit positions of the trapped row address value 1101 even before any error is determined in adjacent wordlines in the cache 25. For example, view 612 shows that adjacent row address values 1110 and 1111 have matching first and second row address bit values to the trapped row address value 1101 as determined by the controller 60, and the controller 60 is configured to mark the wordlines/rows for adjacent row address values 1110 and 1111 as failures (i.e., a forced poison status) even though no errors are detected on the wordlines/rows for adjacent row address values 1110 and 1111. Since the initial error was found in the trapped row address value 1101 and the second error was found for the wordline of row address value 1110 (with matching first and second row address bit positions), the controller 60 (via row compare mask 680) is configured mark all wordlines in cache 25 matching the first and second row address bit positions (of trapped row address value 1101) as failed wordlines. Accordingly, view 612 shows that the all wordlines having the row address values beginning with '1' in the first row address bit position and '1' in the second row address bit position are marked as wordline failures.

Note that when comparing one row address value to another row address value, the comparison is between the same bit position within the two row address values being compared. There are four bit positions illustrated herein, but more or less can be utilized, and a match is found when the same row address bit position has the exact same value. So if the one row address value as a '1' in the first bit position and the other address value has '1' in its first bit position, then the first bit positions match for these two row address values. Additionally, the first mask bit in the row compare mask 680 has to be in active status (i.e., turned on), in order for the first bit position in the one row address value to be compared against the first bit position in the other row address value. As discussed herein, the comparison (check for a match) only occurs for those bit positions that have a mask bit in active status in the row compare mask 680.

Now, another example scenario is illustrated in FIGS. 7A through 7F according to an embodiment. FIGS. 7A through 7F illustrate fast accumulation of row fails by the controller 60.

Figures 7A, 7B:
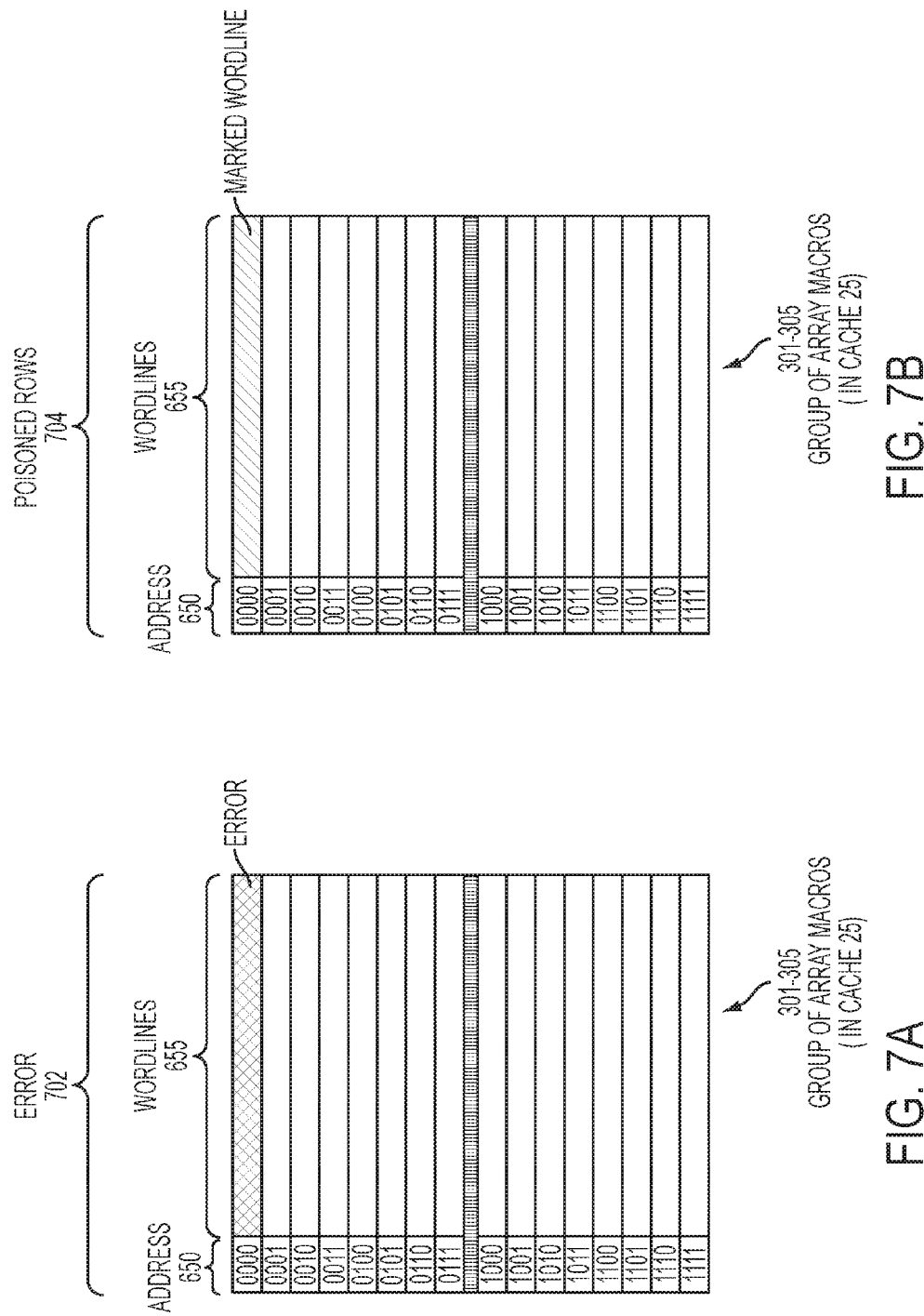
FIGS. 7A through 7F illustrate fast accumulation of row fails in accordance with an embodiment.

FIG. 7A is an illustration of a logical view of a combination of the group of array macros 300-305 (i.e., forming an ECC word 310), such as for example, in the L3 cache 25. View 702 shows the cache 25 with wordlines 655 and their respective row addresses 650, where one of the wordlines 655 can be the wordline 240. The view 702 shows that the controller 60 has determined an error in one of the wordlines 655 in the cache 25. The controller 60 is configured to determine that the error is on the wordline having the row address value/bits 0000.

FIG. 7B shows view 704 illustrating that the wordline for row address bits/values 0000 is marked as poisoned such that data is no longer stored on and/or accessed from this poisoned wordline/row or data that is accessed is marked with SPUE. The wordline corresponding to row address value 0000 has failed. The row address value 0000 of the poisoned wordline is trapped in the register 150 in the L3 cache 25 (i.e., the row address value 0000 is stored in the register 150 by the cache 25).

Figure 7C:
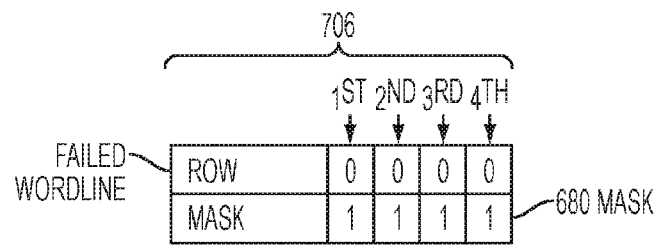

FIG. 7C shows view 706 which illustrates the trapped row address value 0000 for the (failed) wordline marked as poisoned, along with the corresponding mask bits in the row compare mask 680. As noted above, the row compare mask 680 may be stored in the cache 25, and/or the row compare mask 680 may be stored in the register 150 along with the trapped row address value 0000 for the failed wordline.

The row compare mask 680 is shown with four bits (first, second, third, fourth), and each bit of the row compare mask 680 is directly associated with a corresponding row address bit (first, second, third, fourth) in the row address value 0000 of the failed wordline. The mask bits in the row compare mask 680 indicate which corresponding bit/value of the row address value 0000 is to be compared against the row address value of a wordline being accessed in the same cache 25. As noted above, a one (1) in the row compare mask 680 denotes an active status for comparing against the corresponding row address bit, while a zero (0) in the row compare mask 680 denotes an inactive status for comparing against the corresponding row address bit.

Figure 7D:
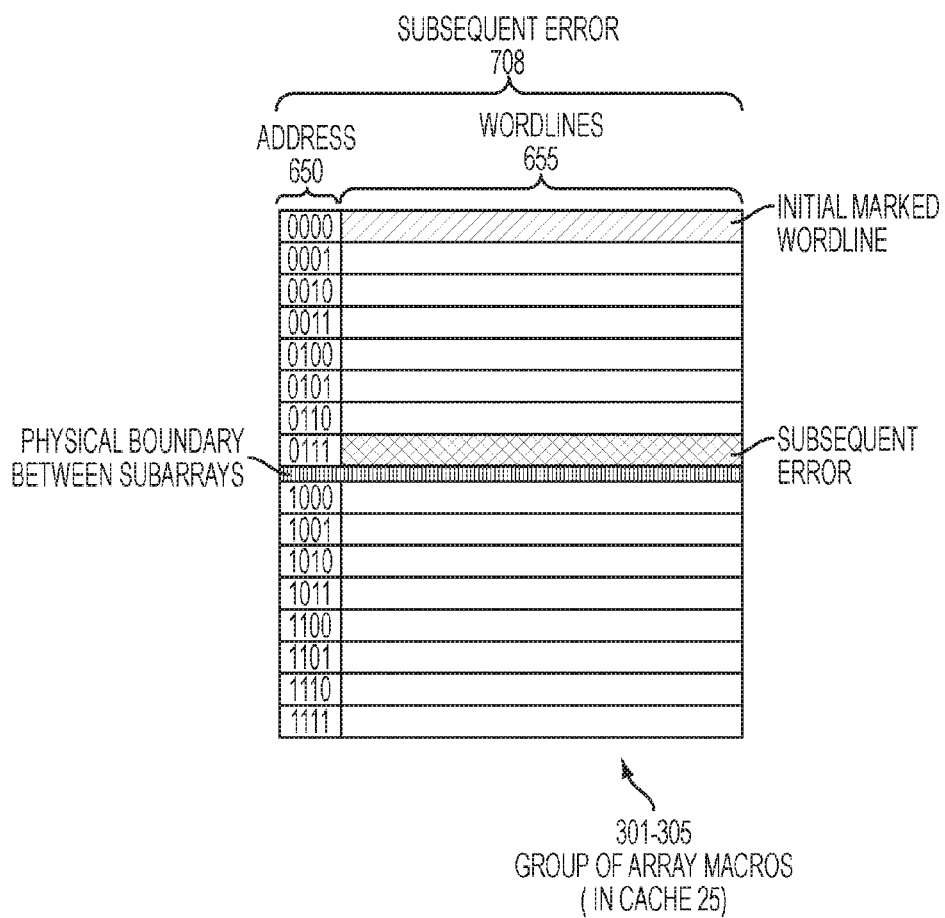

FIG. 7D shows view 708 which illustrates that the controller 60 has found a subsequent (new) error for the wordline having the row address value 0111 in the cache 25. Since the view 706 shows that all of the mask bits in the row compare mask 680 are initially in active status (e.g., all turned on), the controller 60 is configured to compare each individual row bit position in the trapped row address value 0000 against corresponding row bit positions in the row address value 0111 of the new wordline having the error. Each row address bit position of the trapped row address value 0000 is compared against each corresponding row address bit position in the row address value 0111 of the subsequent error to determine if a match is found at any row address bit position. From this row address bit position by position comparison, the controller 60 determines that the first row address bit position in the trapped row address value 0000 of the trapped wordline/row (poisoned wordline) matches the first bit position in the row address value 0111 of the subsequent error. There is no match for the second, third, and fourth row address bit positions.

Figure 7E:
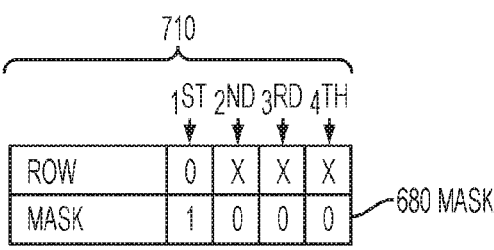

When the controller 60 determines that any row address bit positions of the row address value 0000 match the same row address bit positions of the row address value 0111 (i.e., the wordline with the subsequent error in the cache 25), the controller 60 is configured to modify mask bits in the row compare mask 680, such that only the row bit positions that match remain in active status (i.e., stay turned on) in the row compare mask 680, while the non-matching row address bit positions are reset to inactive status. For example, FIG. 7E shows view 710 which illustrates that the row compare mask 680 has zeros (0's) in the second, third, and fourth mask bit positions because the row address value 0000 did not match the second, third, and fourth row bit positions of the row address value 0111. Therefore, the controller 60 is configured to reset the second, third, and fourth mask bit positions to zero in the row compare mask 680, such that for new accesses to the cache 25 no comparison is to be made against the second, third, and fourth row address positions of the trapped row address value 0000. Accordingly, for a new row address value of a wordline accessing the cache 25, the controller 60 is configured to only compare the first row address bit position of the trapped row address value 0000 against the first row address bit position of the new row address value of the wordline (because the row compare mask 680 has nullified the comparison of the second, third, and fourth row address bit positions). For each new access to the L3 cache 25, any row address bit matching the trapped row address value 0000 (for mask bits on (active) (e.g., the first row address bit position)) will be marked poison (in the cache 25) by the controller 60.

Figure 7F:
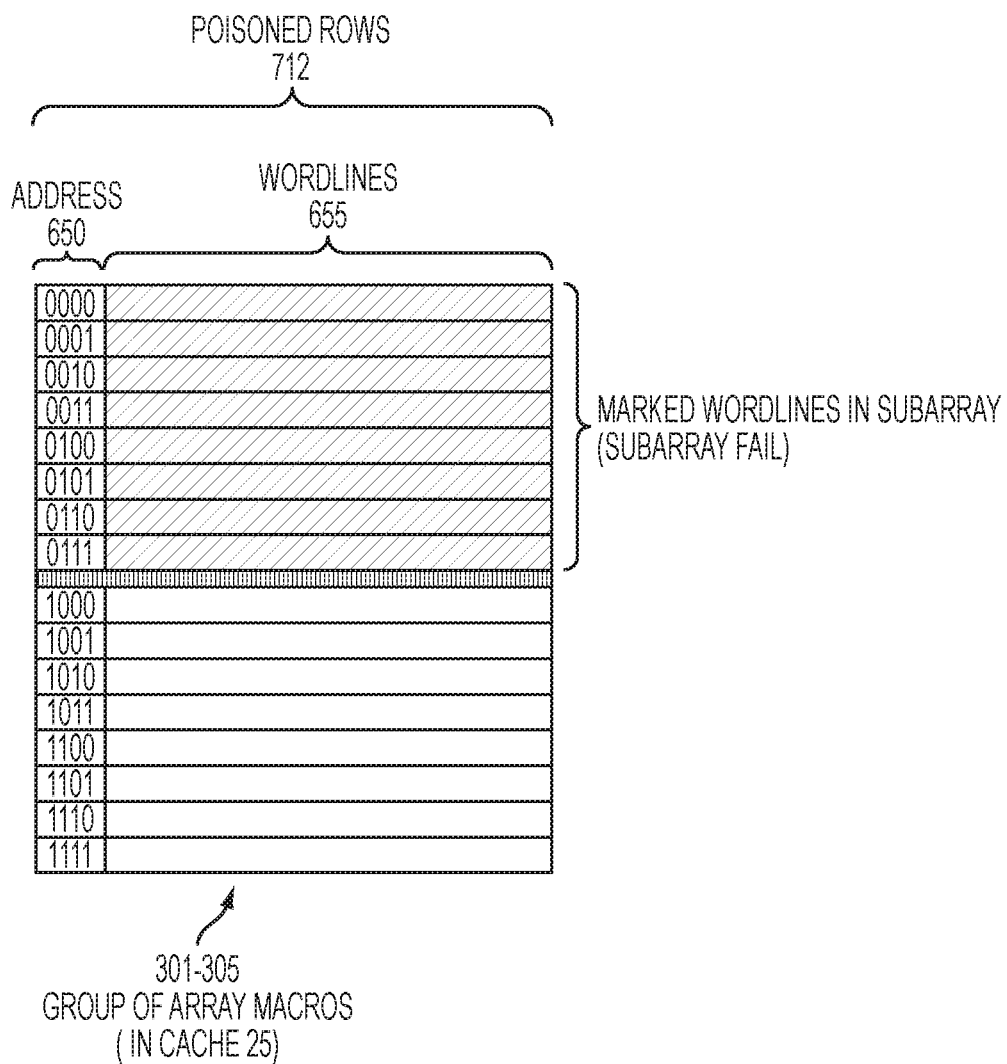

Further, FIG. 7F shows that the controller 60 is configured to automatically and preemptively accumulate, e.g., adjacent wordline failures by finding wordlines in the cache 25 that have the row address values matching the first row address bit position of the trapped row address value 0000 even before any error is determined in the adjacent wordlines in the cache 25. In this case, the controller 60 identifies the wordlines having row addresses values matching the first row address bit position of the trapped row address value 0000 and takes the entire subarray offline. For example, view 712 shows that adjacent row address values 0001, 0010, 0011, 0100, 0101 through 0110 all have a matching first row address bit value as first row address bit value in the trapped row address value 0000 as determined by the controller 60, and the controller 60 is configured to mark the wordlines/rows for adjacent row address values 0001 through 0111 as failures (i.e., a forced poison status) even though no errors are detected on the wordlines/rows for these adjacent row address values 0001 through 0110. Since the initial error was found in the trapped row address value 0000 and the second error was found in the wordline of row address value 0111 (with matching first row address bit positions), the controller 60 (via row compare mask 680) is configured mark all wordlines in cache 25 matching the first row address bit position (of trapped row address value 0000) as failed wordlines. Accordingly, view 712 shows that the all wordlines having the row address value of '0' at the first row address bit position (i.e., matching the first row address bit position of the trapped row address value 0000) are preemptively marked as wordline failures.

Figure 8A:
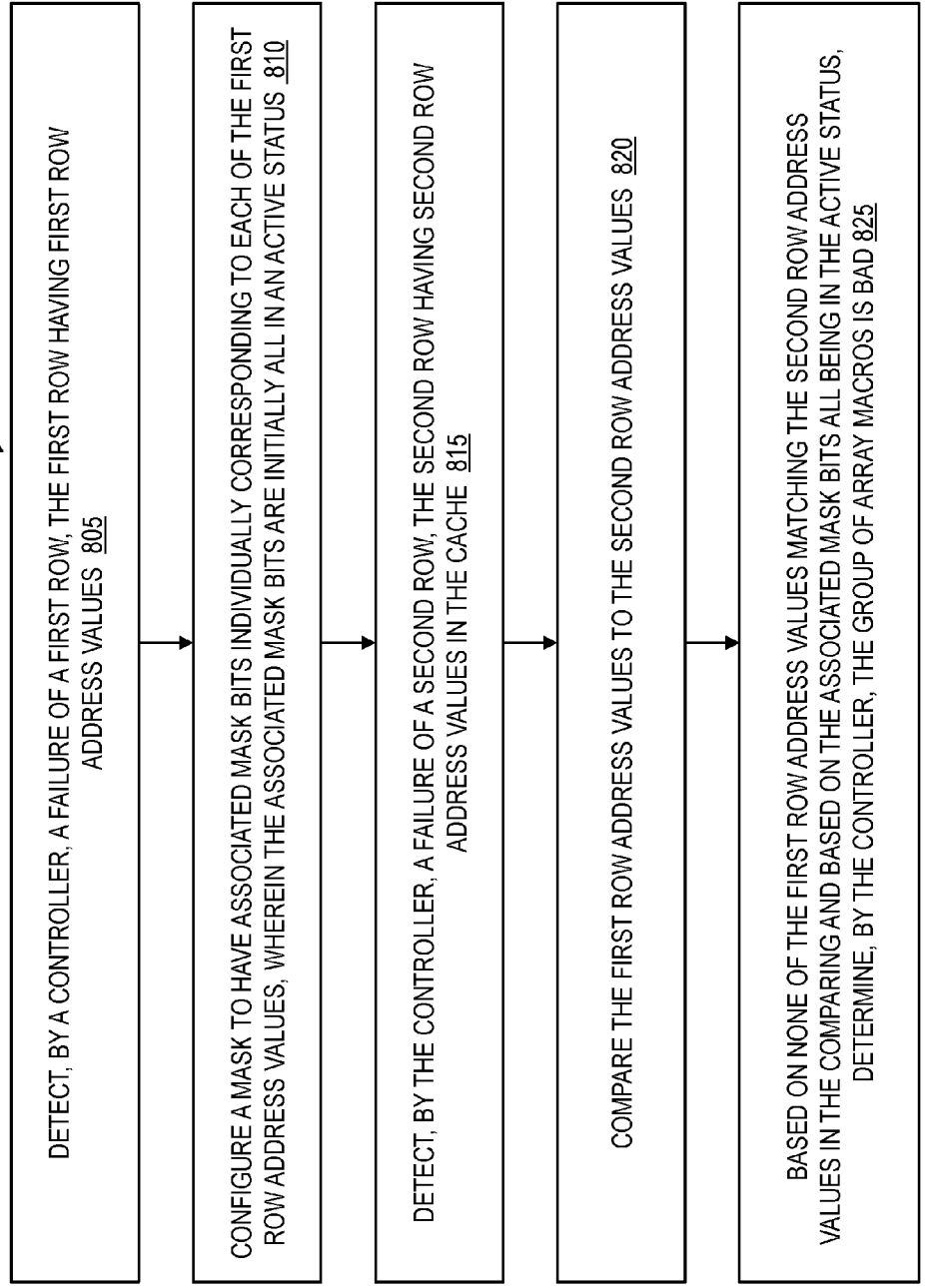

Now turning to FIGS. 8A and 8B, a method 800 for accumulating row/wordline failures is provided according to an embodiment. Reference can be made to FIGS. 1-7 and 9. The method 800 can be executed on the computer system 100, such as by the processor cores 10, and/or the controllers 60, 61, 62. For example purposes, the controller 60 and the cache 25 are discussed, but the discussions apply by analogy to the L4 cache 30 and the system memory 35. It is understood that the cache 25 may have hundreds of groups of array macros 300-305 (where each individual group of array macros 300-305 together forms an ECC word 310), and the method 800 applies by analogy to each of the individual groups of array macros 300-305.

At block 805, the controller 60 is configured to detect a failure (e.g., an initial error) of a first row (e.g., wordline) in the group of array macros 300-305 in cache 25 (which may be, e.g., the group of array macros 300-305 functioning as a single unit), and the first row has a first row address value. In the scenario of FIG. 6, the first row address values 1101 correspond to the first row. In the scenario of FIG. 7, the first row address values 0000 correspond to the first row.

At block 810, the controller 60 is configured to configure a mask (e.g., row compare mask 680) to have associated mask bits individually corresponding to each of the first row address values, and the associated mask bits are initially all in an active status. Initially, the mask bits are all set to '1' as shown in FIGS. 6C and 7C.

At block 815, the controller 60 is configured to detect a failure (a subsequent error in (group of array macros 300-305) the cache 25) of a second row having second row address values in the (group of array macros 300-305) cache 25. For example, a subsequent error is detected in the wordline for the second row address value 1110 in FIG. 6D. In FIG. 7D, a subsequent error is detected in the wordline corresponding to the second row address value 0111.

In response to detecting the (next) failure in the second row, the controller 60 is configured to compare the first row address values to the second row address values at block 820; when none of the first row address values matches the second row address values (for their respective address bit positions) in the comparing and when the associated mask bits all in the active status, the controller 60 is configured to determine that the group of array macros 300-305 is bad (i.e., the entire group of array macros 300-305 needs to be taken off line) in the cache 25 at block 825. Note that FIGS. 6 and 7 illustrate taking part of the wordlines off line, such as adjacent wordlines and/or a subarray of wordlines within the group of array macros 300-305. However, block 820 illustrates the particular condition in which the controller 60 is configured to take the entire group of array macros 300-305 in cache 25 off line, because the controller 60 determines that the entire group is bad when both none of the corresponding address bit positions match in first row address values and second row address values and when the associated mask bits are all in the active status. Also, in response to detecting the failure of the second row, the controller 60 is configured to, when at least one of the first row address values matches the second row address values in the comparing, keep the associated mask bits in the active status which individually correspond to the at least one of the first row address values that match at block 830, and set the associated mask bits to inactive status that individually correspond non-matching first address values during the comparing at block 835.

At block 840, the controller 60 is configured to, for new accesses to the cache, compare new row addresses values of new rows in the cache 25 only to the first row address values having the associated mask bits in the active status.

At block 845, the controller 60 is configured to accumulate the new rows as row failures, when the new row address values match the first row address values having the associated mask bits in the active status. Also, when the new row address values match the first row address values having the associated mask bits in the active status, the data in the new rows (that match) is poisoned (marked as bad data) by the controller 60.

Further, the controller 60 is configured to store/trap the first row address values of the first row, e.g., in the register 150. The controller 60 is configured to, in response to detecting the failure of the second row and before failures are detected in certain rows in the cache, preemptively set the certain rows as failures in the cache when the certain rows each have row address values matching the first row address values corresponding to the associated mask bits in the active status.

The controller 60 is configured to, in response to detecting the failure of the second row and before failures are detected in a group of adjacent rows, preemptively set the group of adjacent rows as failures in the cache when the group of adjacent rows each have adjacent row address values matching the first row address values corresponding to the associated mask bits in the active status.

The controller 60 is configured to, in response to detecting the failure of the second row and before failures are detected in a subarray of rows, preemptively set the subarray of rows as a subarray failure in the cache when the subarray of rows each has row address values matching the first row address values corresponding to the associated mask bits in the active status.

The associated mask bits in the active status indicate which ones of the first row address values are to be compared against. The associated mask bits in the inactive status indicate which ones of the first row address values are not to be compared against.

The controller 60 is configured to preemptively take certain rows offline when it is determined that row address values of the certain rows match the at least one of the first row address values having the associated mask bits in active status. Accordingly, the certain rows in the cache are taken offline and/or marked as poisoned before any error is detected on the certain rows.

Figure 9:
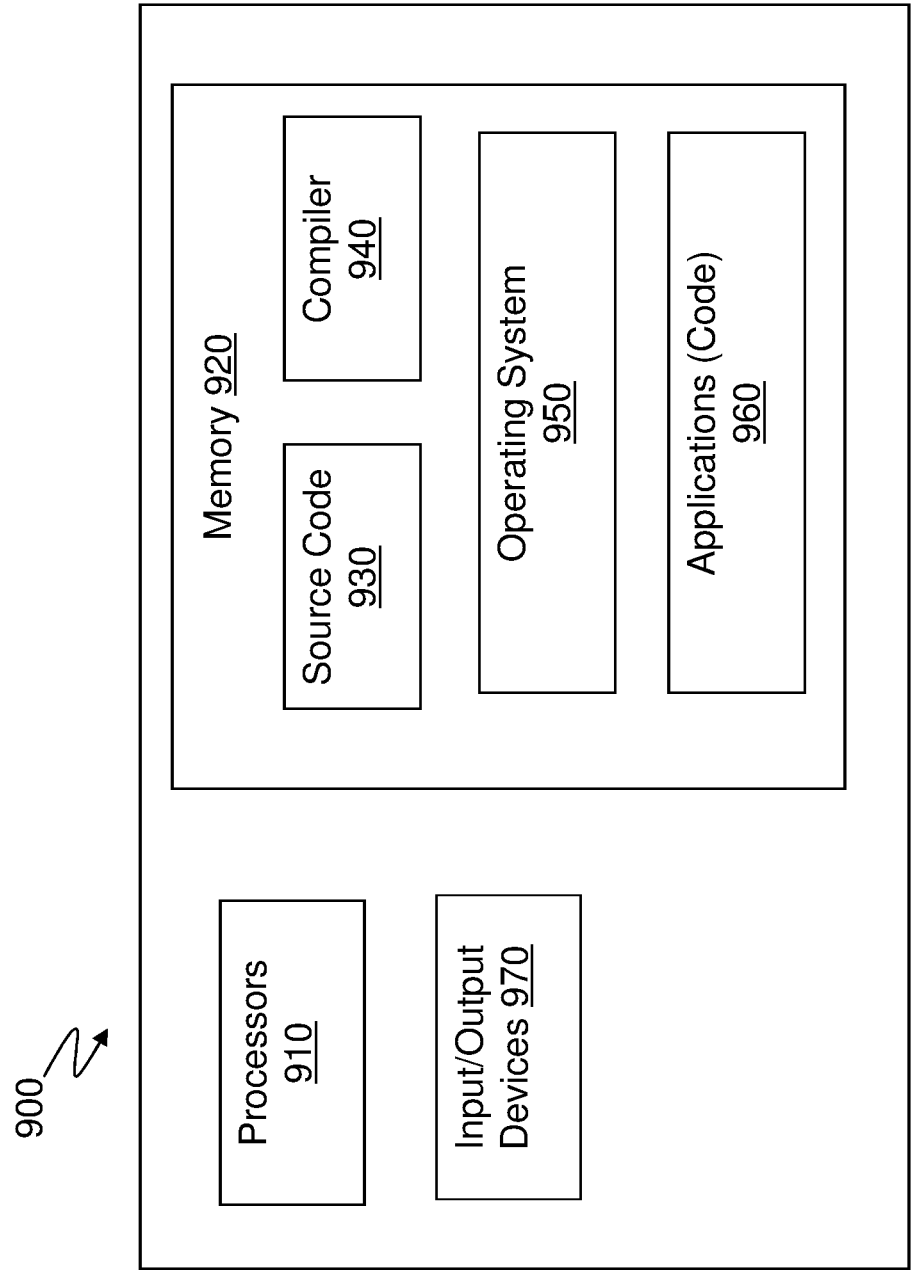
FIG. 9 illustrates an example of a computer having capabilities, which may be included and utilized in embodiments.

FIG. 9 illustrates an example of a computer 900 (e.g., as part of the computer system) having capabilities, which may be included in exemplary embodiments. Various methods, procedures, modules, flow diagrams, tools, applications, circuits, elements, and techniques discussed herein may also incorporate and/or utilize the capabilities of the computer 900. Moreover, capabilities of the computer 900 may be utilized to implement features of exemplary embodiments discussed herein. One or more of the capabilities of the computer 900 may be utilized to implement, incorporate, to connect to, and/or to support any element discussed herein (as understood by one skilled in the art) in FIGS. 1-8.

Generally, in terms of hardware architecture, the computer 900 may include one or more processors 910, computer readable storage memory 920, and one or more input and/or output (I/O) devices 970 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 910 is a hardware device for executing software that can be stored in the memory 920. The processor 910 can be virtually any custom made or commercially available processor, a central processing unit (CPU), a data signal processor (DSP), or an auxiliary processor among several processors associated with the computer 900, and the processor 910 may be a semiconductor based microprocessor (in the form of a microchip) or a microprocessor. Note that the memory 920 can have a distributed architecture, where various components are situated remote from one another, but can be accessed by the processor 910.

The software in the computer readable memory 920 may include one or more separate programs, each of which comprises an ordered listing of executable instructions for implementing logical functions. The software in the memory 920 includes a suitable operating system (O/S) 950, compiler 940, source code 930, and one or more applications 960 of the exemplary embodiments. As illustrated, the application 960 comprises numerous functional components for implementing the features, processes, methods, functions, and operations of the exemplary embodiments. The application 960 of the computer 900 may represent numerous applications, agents, software components, modules, interfaces, controllers, etc., as discussed herein but the application 960 is not meant to be a limitation.

The operating system 950 may control the execution of other computer programs, and provides scheduling, input-output control, file and data management, memory management, and communication control and related services.

The application 960 may be a source program, executable program (object code), script, or any other entity comprising a set of instructions to be performed. When a source program, then the program is usually translated via a compiler (such as the compiler 940), assembler, interpreter, or the like, which may or may not be included within the memory 920, so as to operate properly in connection with the O/S 950. Furthermore, the application 960 can be written as (a) an object oriented programming language, which has classes of data and methods, or (b) a procedure programming language, which has routines, subroutines, and/or functions.

The I/O devices 970 may include input devices (or peripherals) such as, for example but not limited to, a mouse, keyboard, scanner, microphone, camera, etc. Furthermore, the I/O devices 970 may also include output devices (or peripherals), for example but not limited to, a printer, display, etc. Finally, the I/O devices 970 may further include devices that communicate both inputs and outputs, for instance but not limited to, a MC or modulator/demodulator (for accessing remote devices, other files, devices, systems, or a network), a radio frequency (RF) or other transceiver, a telephonic interface, a bridge, a router, etc. The I/O devices 970 also include components for communicating over various networks, such as the Internet or an intranet. The I/O devices 970 may be connected to and/or communicate with the processor 910 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 900 is in operation, the processor 910 is configured to execute software stored within the memory 920, to communicate data to and from the memory 920, and to generally control operations of the computer 900 pursuant to the software. The application 960 and the O/S 950 are read, in whole or in part, by the processor 910, perhaps buffered within the processor 910, and then executed.

When the application 960 is implemented in software it should be noted that the application 960 can be stored on virtually any computer readable storage medium for use by or in connection with any computer related system or method.

The application 960 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 960 is implemented in hardware, the application 960 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 900 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Technical effects and benefits include a controller (e.g., circuit) that utilizes checking of multiple ECC words accessed with the same wordline (or subarray or other common regions of logic or arrays) to detect gross errors with a higher degree of detection.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for taking a wordline offline based on errors, the computer program product comprising a non-transitory computer readable storage medium having program instructions embodied therewith, the program instructions executable by a cache controller to cause the cache controller to perform a method comprising:

reading, by the cache controller, the wordline in a cache, wherein the wordline is utilized to read a plurality of ECC words in the cache;

in response to reading the wordline, detecting, by the cache controller, errors on the wordline;

in response to detecting the errors, determining, by the cache controller, that the wordline is a bad wordline to be taken offline based on the wordline comprising at least one of the conditions:

one ECC word having an uncorrectable error and another ECC word having a correctable error; and one certain ECC word having the correctable error and another certain ECC word having the correctable error;

when the wordline comprises the at least one of the conditions to be the bad wordline, the cache controller is configured to at least one of:

store a bad wordline address of the bad wordline such that any future reference to the bad wordline is flagged as the uncorrectable error, cause a dynamic or static repair of the bad wordline, fence off any wordlines having had the uncorrectable error detected, and perform calling home in order to have the bad wordline ticketed for repair;

monitoring, by the cache controller, future accesses to the cache, thereby allowing the cache controller to cover multiple fail modes;

finding, by the cache controller, adjacent wordlines in the cache that have wordline addresses matching portions of the bad wordline address of the bad wordline; and marking, by the cache controller, the adjacent wordlines as bad wordlines.

* * * * *